United States Patent
Hu et al.

(10) Patent No.: US 8,933,494 B1
(45) Date of Patent: Jan. 13, 2015

(54) IMAGE SENSOR PIXEL CELL HAVING DUAL SELF-ALIGNED IMPLANTS NEXT TO STORAGE GATE

(71) Applicant: Omnivision Technologies, Inc., Santa Clara, CA (US)

(72) Inventors: Sing-Chung Hu, San Jose, CA (US); Dajiang Yang, San Jose, CA (US); Zhenhong Fu, San Jose, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days.

(21) Appl. No.: 14/038,336

(22) Filed: Sep. 26, 2013

(51) Int. Cl.
*H01L 27/148* (2006.01)

(52) U.S. Cl.
CPC .... *H01L 27/14812* (2013.01); *H01L 27/14831* (2013.01)
USPC .......................................................... 257/223

(58) Field of Classification Search
CPC ................... H01L 27/14812; H01L 27/14831
USPC ........................................ 257/223; 438/73
See application file for complete search history.

(56) References Cited

U.S. PATENT DOCUMENTS

| 8,089,036 B2 | 1/2012 | Manabe |
| 8,298,853 B2 * | 10/2012 | Adkisson et al. ............... 438/73 |
| 2013/0188078 A1 | 7/2013 | Shim et al. |

* cited by examiner

*Primary Examiner* — William D Coleman
(74) *Attorney, Agent, or Firm* — Blakely Sokoloff Taylor & Zafman LLP

(57) ABSTRACT

A pixel cell includes a storage transistor including a deep implant storage region having a first polarity is implanted in a semiconductor substrate to store image charge accumulated by a photodiode. A transfer transistor is coupled between the photodiode and an input of the storage transistor to selectively transfer the image charge from the photodiode to the storage transistor. An output transistor is coupled to an output of the storage transistor to selectively transfer the image charge from the storage transistor to a readout node. A first shallow implant region having the first polarity is implanted in the semiconductor substrate under a first spacer region between a transfer gate of the transfer transistor and a storage gate of the storage transistor. A second shallow implant region having the first polarity is implanted in the semiconductor substrate under a second spacer region between the storage gate and the output gate.

23 Claims, 2 Drawing Sheets

IMAGE SENSOR PIXEL CELL HAVING DUAL SELF-ALIGNED IMPLANTS NEXT TO STORAGE GATE

BACKGROUND INFORMATION

1. Field of the Disclosure

The present invention relates generally semiconductor processing. More specifically, examples of the present invention are related to semiconductor processing of image sensor pixel cells having global shutters.

2. Background

For high-speed image sensors, a global shutter can be used to capture fast-moving objects. A global shutter typically enables all pixel cells in the image sensor to simultaneously capture the image. For slower moving objects, the more common rolling shutter is used. A rolling shutter normally captures the image in a sequence. For example, each row within a two-dimensional ("2D") pixel cell array may be enabled sequentially, such that each pixel cell within a single row captures the image at the same time, but each row is enabled in a rolling sequence. As such, each row of pixel cells captures the image during a different image acquisition window. For slow moving objects the time differential between each row generates image distortion. For fast-moving objects, a rolling shutter causes a perceptible elongation distortion along the object's axis of movement.

To implement a global shutter, storage capacitors or storage transistors, which may also be referred to as storage gates herein, can be used to temporarily store the image charge acquired by each pixel cell in the array while it awaits readout from the pixel cell array. When a global shutter is used, a transfer transistor is typically used to transfer image charge from the photodiode to the storage transistor, and then an output transistor is used to transfer the stored image charge from the storage transistor to a readout node of the pixel cell.

Factors that affect performance in an image sensor pixel cell having a global shutter include shutter efficiency, dark current, white pixels and image lag. The spacing between the transfer, storage, and output transistor structures, may have a significant impact on these factors. One tradeoff faced by designers when designing pixel cells is that as the structures of neighboring transistors (e.g., the transfer, storage transistors, and output transistors) are overlapped to reduce lag, some of the electrons become trapped in the deep implant regions between the neighboring transistors that cause "pinched" channels, which prevent some of the electrons from flowing to the output floating diffusions during transfer.

BRIEF DESCRIPTION OF THE DRAWINGS

Non-limiting and non-exhaustive examples of the present invention are described with reference to the following figures, wherein like reference numerals refer to like parts throughout the various views unless otherwise specified.

Figure 1:
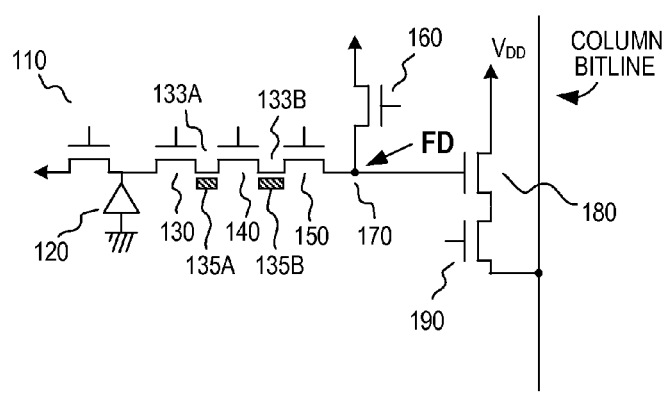
FIG. 1 is a schematic illustrating one example of a pixel cell having dual self-aligned implants in spacer regions next to a storage gate in accordance with the teachings of the present invention.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

As will be shown, methods and apparatuses directed to an image sensor pixel cell having dual self-aligned implants in spacer regions next to a storage gate are disclosed. In the following description, numerous specific details are set forth in order to provide a thorough understanding of the present invention. In the following description numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment," an embodiment, "one example," or "an example" means that a particular feature, structure, or characteristic described in connection with the embodiment or example is included in at least one embodiment or example of the present invention. Thus, the appearances of the phrases such as "in one embodiment" or "in one example" in various places throughout this specification are not necessarily all referring to the same embodiment or example. Furthermore, the particular features, structures, or characteristics may be combined in any suitable manner in one or more embodiments or examples. The following is a detailed description of the terms and elements used in the description of examples of the present invention by referring to the accompanying drawings.

As will be shown, an imaging system having image sensor pixel cells having dual self-aligned implants in spacer regions next to a storage gate in accordance with the teachings of the present invention enables an image sensor pixel cell array with a global shutter with reduced photodiode and storage gate lag. Furthermore, as will be discussed, the risks of undesired dark current and white pixels are also reduced with pixel cells having the dual self-aligned implant structures in the spacer regions next to a storage gate in accordance with the teachings of the present invention. In particular, most electrons that are trapped in typical pixel cells with overlapped deep implant regions to reduce photodiode lag are trapped between the transfer transistor and storage transistor structures due to deep storage transistor implants. Reductions in the overlap between transfer transistor and storage transistor help to reduce the number of electrons that are trapped in the deep implant region between the transfer transistor and storage transistor, but at the expense of increased photodiode lag.

As will be discussed in further detail below, in one example, an image sensor pixel cell in accordance with the teachings of the present invention includes a deep N-type implant under the storage gate of the pixel cell, which provides a deep electron storage region and reduces dark current and white pixels. However, in one embodiment the deep N-type implant under the storage gate of the pixel cell does not extend substantially into the spacer regions next to the storage gate. Instead, dual self-aligned shallow N-type implants are formed in the spacer region between the transfer and storage transistor gates, and in the spacer region between the storage and output transistor gates. The dual self-aligned shallow N-type implants connect the deep electron storage region provided by the deep N-type implant under the storage transistor gate to the transfer transistor channel and the output transistor channel to reduce both photodiode and storage transistor lag in accordance with the teachings of the present invention. Furthermore, shallow P-type implants are implanted in the spacer regions next to the storage transistor gate, which reduce dark current and white pixels in accordance with the teachings of the present invention.

FIG. 1 is a schematic illustrating one example of a pixel cell 100 with a global shutter in accordance with the teachings of the present invention. In one example, pixel cell 100 is included in a front side illuminated (FSI) image sensor and includes a global shutter transistor 110, a photodiode 120, a transfer transistor 130, a storage transistor 140, an output transistor 150, a floating diffusion 170, a reset transistor 160, an amplifier transistor 180, and a row-select transistor 190 coupled to a column bitline as shown. In one example, a first self-aligned implant 135A is implanted in the semiconductor material in the spacer region 133A between the gate of transfer transistor 130 and the gate of storage transistor 140 in accordance with the teachings of the present invention. In addition, a second self-aligned implant 135B is implanted in the semiconductor material in the spacer region 135B between the gate of storage transistor 140 and the gate of output transistor 150 in accordance with the teachings of the present invention. As will be discussed, in one example, the dual self-aligned implants 135A and 135B are shallow regions that connect a deep electron storage region under the gate of storage transistor 140 to the transfer transistor 130 channel and the output transistor 150 channel to reduce both photodiode 120 lag and storage transistor 140 lag in accordance with the teachings of the present invention.

Figure 2:
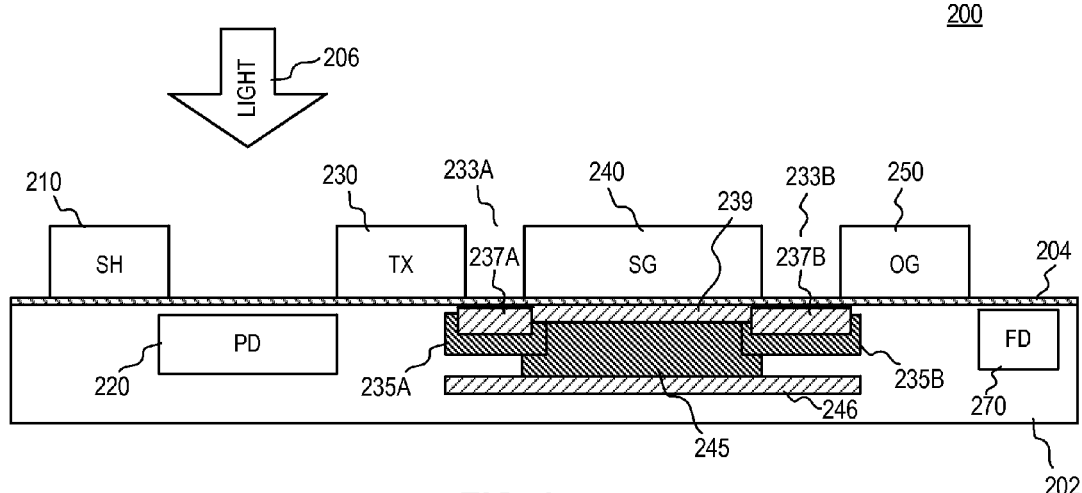
FIG. 2 is a cross-section view illustrating one example of a pixel cell having a dual self-aligned implants in spacer regions next to a storage gate in accordance with the teachings of the present invention.

To illustrate, FIG. 2 is a cross-section view showing one example of a pixel cell 200 in accordance with the teachings of the present invention. It is noted that pixel cell 200 of FIG. 2 in one example is a cross-section view of pixel cell 100 of FIG. 1, and that similarly named and numbered elements referenced below are coupled and function similar to as described above. As shown in the example depicted in FIG. 2, pixel cell 200 is a front side illuminated (FSI) pixel cell that includes a photodiode 220 disposed in a semiconductor substrate 202 to accumulate image charge from light 206, which is directed thereto. In one example, the image charges accumulated in photodiode 220 are electrons. In one example, light 206 is representative of a portion of an image directed through a lens to pixel cell 200. In one example, a global shutter transistor, including a shutter gate 210 disposed over gate oxide 204 and semiconductor substrate 202, is included in pixel cell 200, which may be utilized in order to selectively deplete (photo-voltaically generated) charges in photodiode 220. A storage transistor, including a storage gate 240 disposed over gate oxide 204 and semiconductor substrate 202, is disposed in the semiconductor substrate 202 to store the image charge. A transfer transistor, including a transfer gate 230 disposed over gate oxide 204 and semiconductor substrate 202, is disposed between the photodiode 220 and the storage transistor to selectively transfer the image charge from the photodiode 220 to the storage transistor. An output transistor, including an output gate 250 disposed over gate oxide 204 and semiconductor substrate 220, is disposed in the semiconductor substrate 202 and coupled to an output of the storage transistor to selectively transfer the image charge from the storage transistor to a readout node, which in one example includes the floating diffusion 270 disposed in the semiconductor substrate 202. In one example, shutter gate 210, transfer gate 230, storage gate 240 and output gate 250 include polysilicon.

Continuing with the example depicted in FIG. 2, an implant 245 having a first polarity is implanted in semiconductor substrate 202 through an opening under the storage gate 240 before the polysilicon of storage gate 240 is formed. In one example, the first polarity is provided with N-type dopants. In the example, implant 245 provides a deep image charge storage region under the storage gate 240, and is a deep implant, which helps to reduce dark current and white pixels. As shown in the depicted example, implant 245 does not extend substantially under the spacer regions 233A and 233B next to the storage gate 240 of pixel cell 200 in accordance with the teachings of the present invention.

As shown in FIG. 2, example pixel cell 200 also includes dual self-aligned implants 235A and 235B, which are implanted in semiconductor substrate 202 after the polysilicon of storage gate 240 has been formed such that implants 235A and 235B are formed under the spacer regions 233A and 233B next to storage transistor gate 240, between the transfer transistor gate 230 and the storage transistor gate 240, and between the storage transistor gate 240 and the output transistor gate 250 as shown. In one example, dual self-aligned implants 235A and 235B are shallow implants having the first polarity and are formed through larger openings such there is some overlap with the transfer transistor and output transistor regions as shown. With the overlap as shown, the dual self-aligned implants 235A and 235B connect the deep electron storage region provided with implant 245 to the transfer transistor and output transistor channel regions to reduce both photodetector lag and storage transistor lag in accordance with the teachings of the present invention.

The example shown in FIG. 2 shows that example pixel cell 200 also includes implants 237A and 237B, which are implanted under the spacer regions 233A and 233B in dual self-aligned implants 235A and 235B after the polysilicon of storage gate 240 has been formed. In one example, implants 237A and 237B are shallow implants having a second polarity that is the opposite polarity of the first polarity. In one example, the second polarity is provided with P-type dopants. In the example, implants 237A and 237B to reduce dark current under the spacer regions 233A and 233B next to the storage transistor gate 240, between the transfer transistor gate 230 and the storage transistor gate 240, and between the storage transistor gate 240 and the output transistor gate 250 in accordance with the teachings of the present invention. The shallow implants 237A and 237B reduce dark currents under the spacer regions where the shallow dual self-aligned implants 235A and 235B would have increased dark currents by being closer to the oxide interface near gate oxide 204 in accordance with the teachings of the present invention.

In the example depicted in FIG. 2, pixel cell 200 also includes an implant 239 under the storage transistor gate 240 as shown. In one example, implant 239 is a shallow implant and also has the second polarity, which also reduces dark currents under the storage transistor gate 240 where the deep electron storage region provided by implant 245 would have increased dark current by being closer to the oxide interface near gate oxide 204.

In one example, pixel cell 200 also includes an implant 246 below the deep electron storage region provided by implant 245 as depicted in FIG. 2. As shown in the example, implant 246 is a deeper implant having the second polarity, which reduces an implant tail portion of the deep electron storage region provided by implant 245, and therefore pushes electrons closer toward the surface of semiconductor substrate 202 in accordance with the teachings of the present invention.

Therefore, as can be appreciated from the example illustrated in FIG. 2, the deep electron storage region provided with implant 245 is under the storage transistor gate 240 and does not extend substantially under the respective spacer regions 233A and 233B on the sides of the storage transistor gate 240. The dual self-aligned implants 235A and 235B that connect the deep electron storage region provided with implant 245 across the spacer regions 233A and 233B to the transfer transistor channel and to the output transistor channel, respectively, are shallow implants and therefore have a reduced risk of being pinched. The dual self-aligned implants 235A and 235B also provide some overlap to the transfer transistor and output transistor structures to reduce photodiode lag and storage transistor lag in accordance with the teachings of the present invention. The shallow implants 237A and 237B under the spacer regions 233A and 233B have an opposite polarity from the dual self-aligned implants 235A and 235B, and therefore reduce dark currents under the spacer regions 233A and 233B by being closer to the oxide interface near gate oxide 204 in accordance with the teachings of the present invention.

Figure 3:
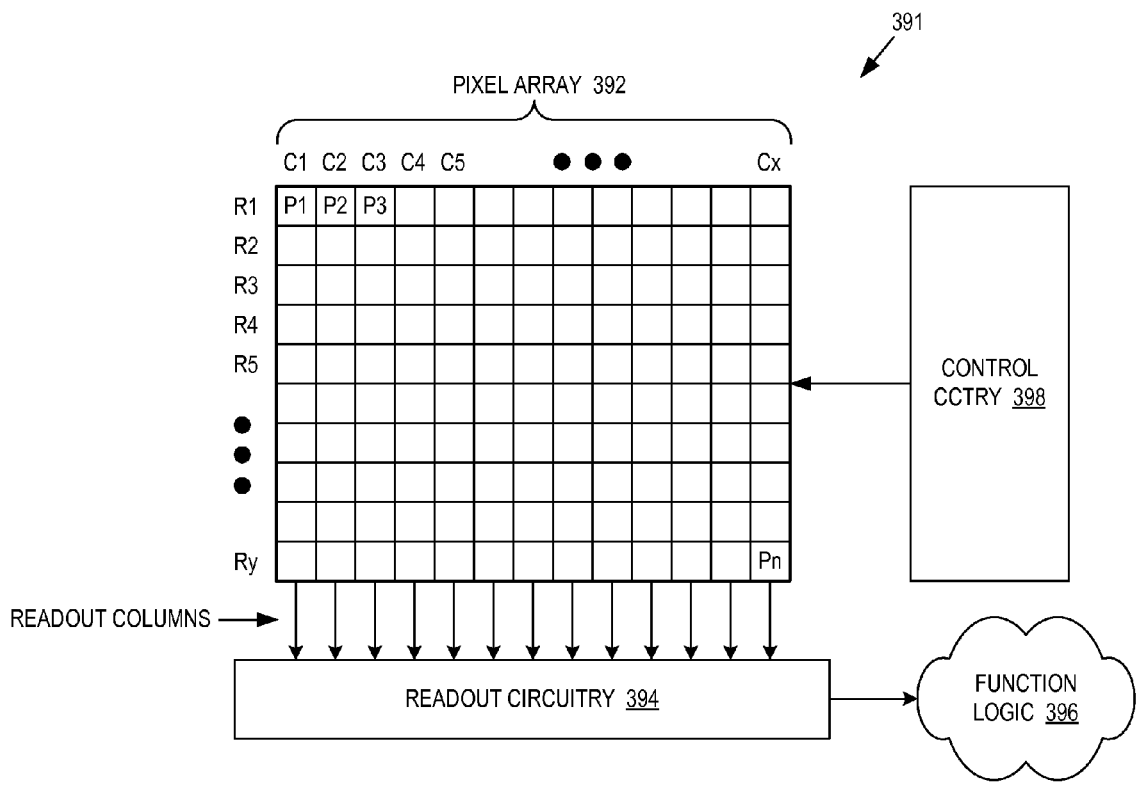
FIG. 3 is a diagram illustrating one example of an imaging system including a pixel array having pixel cells having dual self-aligned implants in spacer regions next to a storage gate in accordance with the teachings of the present invention.

FIG. 3 is a diagram illustrating one example of an imaging system 391 including an example pixel array 392 having a plurality of image sensor pixels cells in accordance with the teachings of the present invention. As shown in the depicted example, imaging system 391 includes pixel array 392 coupled to control circuitry 398 and readout circuitry 394, which is coupled to function logic 396.

In one example, pixel array 392 is a two-dimensional (2D) array of image sensor pixel cells (e.g., pixels P1, P2, P3, Pn). It is noted that the pixel cells P1, P2, Pn in the pixel array 392 may be examples of pixel cell 100 of FIG. 1 and/or of pixel cell 200 of FIG. 2, and that similarly named and numbered elements referenced below are coupled and function similar to as described above. As illustrated, each pixel cell is arranged into a row (e.g., rows R1 to Ry) and a column (e.g., column Cl to Cx) to acquire image data of a person, place, object, etc., which can then be used to render a 2D image of the person, place, object, etc.

In one example, after each pixel cell P1, P2, P3, Pn has acquired its image data or image charge, the image data is readout by readout circuitry 394 and then transferred to function logic 396. In various examples, readout circuitry 394 may include amplification circuitry, analog-to-digital (ADC) conversion circuitry, or otherwise. Function logic 396 may simply store the image data or even manipulate the image data by applying post image effects (e.g., crop, rotate, remove red eye, adjust brightness, adjust contrast, or otherwise). In one example, readout circuitry 394 may readout a row of image data at a time along readout column lines (illustrated) or may readout the image data using a variety of other techniques (not illustrated), such as a serial readout or a full parallel readout of all pixels simultaneously.

In one example, control circuitry 398 is coupled to pixel array 392 to control operational characteristics of pixel array 392. In one example, control circuitry 398 is coupled to generate a global shutter signal for controlling image acquisition for each pixel cell. In the example, the global shutter signal simultaneously enables all pixels cells P1, P2, P3, Pn within pixel array 392 to simultaneously enable all of the pixel cells in pixel array 392 to simultaneously transfer the image charge from each respective photodiode during a single acquisition window.

The above description of illustrated examples of the present invention, including what is described in the Abstract, are not intended to be exhaustive or to be limitation to the precise forms disclosed. While specific embodiments of, and examples for, the invention are described herein for illustrative purposes, various equivalent modifications are possible without departing from the broader spirit and scope of the present invention. Indeed, it is appreciated that the specific example voltages, currents, frequencies, power range values, times, etc., are provided for explanation purposes and that other values may also be employed in other embodiments and examples in accordance with the teachings of the present invention.

These modifications can be made to examples of the invention in light of the above detailed description. The terms used in the following claims should not be construed to limit the invention to the specific embodiments disclosed in the specification and the claims. Rather, the scope is to be determined entirely by the following claims, which are to be construed in accordance with established doctrines of claim interpretation. The present specification and figures are accordingly to be regarded as illustrative rather than restrictive.

What is claimed is:

1. A pixel cell, comprising:
   a storage transistor disposed in a semiconductor substrate, the storage transistor including a storage gate disposed over the semiconductor substrate, a deep implant storage region having a first polarity implanted in a semiconductor substrate under the storage transistor gate to store image charge accumulated by a photodiode disposed in the semiconductor substrate;
   a transfer transistor disposed in the semiconductor substrate and coupled between the photodiode and an input of the storage transistor to selectively transfer the image charge from the photodiode to the storage transistor, the transfer transistor including a transfer gate disposed over the semiconductor substrate;
   an output transistor disposed in the semiconductor substrate and coupled to an output of the storage transistor to selectively transfer the image charge from the storage transistor to a readout node, the output transistor including an output gate disposed over the semiconductor substrate;
   a first shallow implant region having the first polarity and implanted in the semiconductor substrate under a first spacer region between the transfer gate and the storage gate; and
   a second shallow implant region having the first polarity and implanted in the semiconductor substrate under a second spacer region between the storage gate and the output gate.

2. The pixel cell of claim 1 further comprising:
   a third shallow implant region having a second polarity opposite from the first polarity and implanted in the semiconductor substrate in the first shallow implant region under the first spacer region between the transfer gate and the storage gate; and
   a fourth shallow implant region having the second polarity and implanted in the semiconductor substrate in the second shallow implant region under the second spacer region between the storage gate and the output gate.

3. The pixel cell of claim 1 further comprising a fifth shallow implant region having a second polarity opposite from the first polarity and implanted in the semiconductor substrate under the storage gate.

4. The pixel cell of claim 1 further comprising a second deep implant region having a second polarity opposite from the first polarity and implanted in the semiconductor substrate below the deep implant storage region.

5. The pixel cell of claim 1 wherein the transfer gate, the storage gate and the output gate comprise polysilicon.

6. The pixel cell of claim 1 further comprising a gate oxide disposed between the semiconductor substrate and the transfer gate, the storage gate, and the output gate.

7. The pixel cell of claim 1 wherein the readout node comprises a floating diffusion disposed in the semiconductor substrate.

8. The pixel cell of claim 1 wherein the image charge comprises electrons.

9. The pixel cell of claim 1 wherein the deep implant storage region and the first and second shallow implant regions comprise N-type dopants.

10. The pixel cell of claim 1 further comprising:
a reset transistor disposed in the semiconductor substrate and coupled to the readout node;
an amplifier transistor disposed in the semiconductor substrate having an amplifier gate coupled to the readout node; and
a row select transistor disposed in the semiconductor substrate coupled between a bitline and the amplifier transistor.

11. The pixel cell of claim 1 further comprising a shutter gate transistor disposed in the semiconductor substrate and coupled to the photodiode to selectively deplete the image charge from the photodiode.

12. An imaging system, comprising:
a pixel array of pixel cells, wherein each one of the pixel cells includes:
a storage transistor disposed in a semiconductor substrate, the storage transistor including a storage gate disposed over the semiconductor substrate, a deep implant storage region having a first polarity implanted under the storage transistor gate in a semiconductor substrate to store image charge accumulated by a photodiode disposed in the semiconductor substrate;
a transfer transistor disposed in the semiconductor substrate and coupled between the photodiode and an input of the storage transistor to selectively transfer the image charge from the photodiode to the storage transistor, the transfer transistor including a transfer gate disposed over the semiconductor substrate;
an output transistor disposed in the semiconductor substrate and coupled to an output of the storage transistor to selectively transfer the image charge from the storage transistor to a readout node, the output transistor including an output gate disposed over the semiconductor substrate;
a first shallow implant region having the first polarity and implanted in the semiconductor substrate under a first spacer region between the transfer gate and the storage gate; and
a second shallow implant region having the first polarity and implanted in the semiconductor substrate under a second spacer region between the storage gate and the output gate;
control circuitry coupled to the pixel array to control operation of the pixel array; and
readout circuitry coupled to the pixel array to readout image data from the plurality of pixels.

13. The imaging system of claim 12 wherein the control circuitry is coupled to selectively send a global shutter signal to the pixel array to simultaneously enable all of the pixel cells in pixel array to simultaneously transfer the image charge from each respective photodiode during a single acquisition window.

14. The imaging system of claim 12 wherein each one of the pixel cells further comprises:
a third shallow implant region having a second polarity opposite from the first polarity and implanted in the semiconductor substrate in the first shallow implant region under the first spacer region between the transfer gate and the storage gate; and
a fourth shallow implant region having the second polarity and implanted in the semiconductor substrate in the second shallow implant region under the second spacer region between the storage gate and the output gate.

15. The imaging system of claim 12 wherein each one of the pixel cells further comprises a fifth shallow implant region having a second polarity opposite from the first polarity and implanted in the semiconductor substrate under the storage gate.

16. The imaging system of claim 12 wherein each one of the pixel cells further comprises a second deep implant region having a second polarity opposite from the first polarity and implanted in the semiconductor substrate below the deep implant storage region.

17. The imaging system of claim 12 wherein the transfer gate, the storage gate and the output gate comprise polysilicon.

18. The imaging system of claim 12 wherein each one of the pixel cells further comprises a gate oxide disposed between the semiconductor substrate and the transfer gate, the storage gate, and the output gate.

19. The imaging system of claim 12 wherein the readout node comprises a floating diffusion disposed in the semiconductor substrate.

20. The imaging system of claim 12 wherein the image charge comprises electrons.

21. The imaging system of claim 12 wherein the deep implant storage region and the first and second shallow implant regions comprise N-type dopants.

22. The imaging system of claim 12 wherein each one of the pixel cells further comprises:
a reset transistor disposed in the semiconductor substrate and coupled to the readout node;
an amplifier transistor disposed in the semiconductor substrate having an amplifier gate coupled to the readout node; and
a row select transistor disposed in the semiconductor substrate coupled between a bitline and the amplifier transistor.

23. The imaging system of claim 12 wherein each one of the pixel cells further comprises a shutter gate transistor disposed in the semiconductor substrate and coupled to the photodiode to selectively deplete the image charge from the photodiode.

* * * * *